United States Patent
Tran et al.

(10) Patent No.: US 7,872,495 B1
(45) Date of Patent: Jan. 18, 2011

(54) PROGRAMMABLE TERMINATION

(75) Inventors: Toan D. Tran, San Jose, CA (US);
Cheng H. Hsieh, Los Gatos, CA (US);
Mark J. Marlett, Livermore, CA (US)

(73) Assignee: Xilinx, Inc., San Jose, CA (US)

(*) Notice: Subject to any disclaimer, the term of this patent is extended or adjusted under 35 U.S.C. 154(b) by 0 days.

(21) Appl. No.: 12/695,992

(22) Filed: Jan. 28, 2010

Related U.S. Application Data

(60) Provisional application No. 61/148,923, filed on Jan. 31, 2009, provisional application No. 61/148,930, filed on Jan. 31, 2009.

(51) Int. Cl.
*H03K 19/003* (2006.01)

(52) U.S. Cl. .......................... 326/30; 326/34

(58) Field of Classification Search .......... 326/30–34
See application file for complete search history.

(56) References Cited

U.S. PATENT DOCUMENTS

| | | | |
|---|---|---|---|
| 7,205,788 B1* | 4/2007 | Wang et al. | 326/30 |
| 7,692,451 B2* | 4/2010 | Ishikawa | 326/86 |
| 7,782,647 B2* | 8/2010 | Lee et al. | 365/72 |

* cited by examiner

*Primary Examiner*—James Cho
(74) *Attorney, Agent, or Firm*—W. Eric Webostad

(57) ABSTRACT

A unit cell for a programmable termination circuit in an integrated circuit and a method for programming such termination circuit are described. In an embodiment, such unit cells may have three n-type and three p-type transistors. A first transistor is coupled to receive a first float control signal. A second transistor is coupled to receive a second float control signal. The third and fourth transistors are coupled to receive a first termination voltage control signal. The fifth and sixth transistors are coupled to receive a second termination voltage control signal. The first float control signal and the second float control signal are a pair of complementary signals.

20 Claims, 15 Drawing Sheets

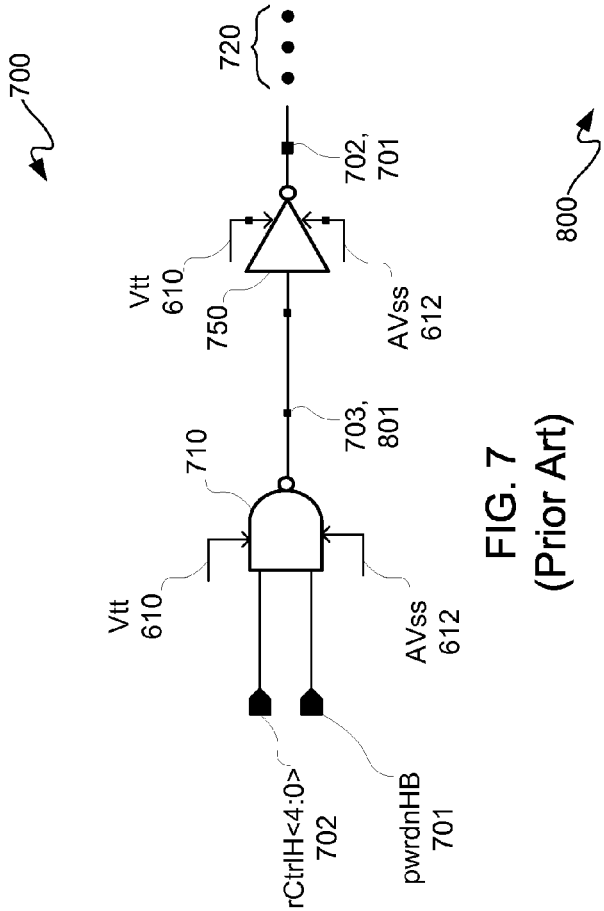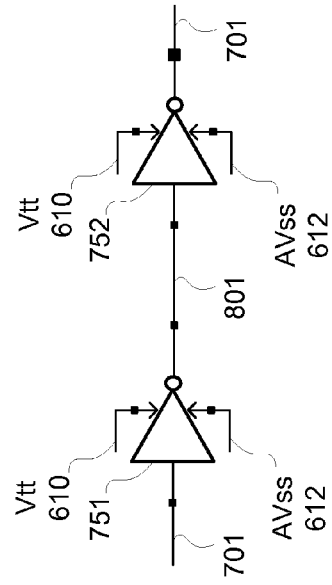
FIG. 7
(Prior Art)
FIG. 8
(Prior Art)

PROGRAMMABLE TERMINATION

CROSS-REFERENCE TO RELATED APPLICATIONS

This application claims benefit of U.S. Provisional Patent Application having the Application No. 61/148,923 filed on Jan. 31, 2009 and entitled "Multi-Gigabit Transceiver"; and also U.S. Provisional Patent Application having the Application No. 61/148,930 filed on Jan. 31, 2009 and entitled "Architecture for Advanced Integrated Circuit Providing High Performance." Both of these provisional patent applications are incorporated herein by reference in their entirety.

FIELD OF THE INVENTION

An embodiment of the invention relates to integrated circuit devices ("ICs"). More particularly, an embodiment of the invention relates to programmable termination for an IC.

BACKGROUND OF THE INVENTION

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As a consequence of functional complexity and electromagnetic parameters, termination, including receiver ("RX") termination, conventionally uses a large die size which entails additional routing capacitance. Unfortunately, unwanted parasitics, such as routing capacitance, associated with such RX termination routing, severely affect performance, such as return loss and bandwidth loss, at high frequency.

Accordingly, it would be desirable and useful to provide to provide a more compact programmable RX termination that generally satisfies both complex functionality and high frequency performance.

SUMMARY OF THE INVENTION

One or more embodiments generally relate to programmable termination in an IC.

An embodiment relates generally to a unit cell for a programmable termination circuit. In such an embodiment, a first transistor has a first source node coupled to a first input node, a first drain node coupled to a second input node, and a first gate coupled to receive a first float control signal. A second transistor has a second source node coupled to the second input node, a second drain node coupled to the first input node, and a second gate coupled to receive a second float control signal. A third transistor has a third drain node coupled to the first input node, a third source node coupled to a first termination voltage node, and a third gate coupled to receive a first termination voltage control signal. A fourth transistor has a fourth drain node coupled to the second input node, a fourth source node coupled to the first termination voltage node, and a fourth gate coupled to receive the first termination voltage control signal. A fifth transistor has a fifth drain node coupled to the second input node, a fifth source node coupled to a second termination voltage node, and a fifth gate coupled to receive a second termination voltage control signal. A sixth transistor has a sixth drain node coupled to the first input node, a sixth source node coupled to the second termination voltage node, and a sixth gate coupled to receive the second termination voltage control signal. The first float control signal and the second float control signal are a first pair of complementary signals.

Another embodiment relates generally to a method for programming a termination circuit. In such an embodiment, the method for programming a termination circuit includes providing a group of unit cells as well as first and second float control signal buses coupled to the group of unit cells. First and second termination voltage control signal buses are coupled to the group of unit cells. States of first transistors of the group of unit cells are set responsive to first float control signals provided via the first float control signal bus. States of second transistors of the group of unit cells are set responsive to second float control signals provided via the second control signal bus. States of third transistors and fourth transistors of the group of unit cells are set responsive to first termination voltage control signals provided via the first termination voltage control signal bus. States of fifth transistors and sixth transistors of the group of unit cells are set responsive to second termination voltage control signals provided via the second termination voltage control signal bus. Each unit cell of the group of unit cells is operated responsive to programming thereof in any of a plurality of modes selected from a group of four modes.

Yet another embodiment relates generally to a programmable termination circuit. In such an embodiment, the programmable termination circuit includes a group of unit cells and control circuit coupled to the group of unit cells via control signal buses for conducting a first float control signal, a first termination voltage control signal, and a second termination voltage control signal. Each of the unit cells includes: a first float transistor for having a first source/drain node coupled to a first input node, a second source/drain node coupled to a second input node, and a first float control gate coupled to receive the first float control signal; a first termination voltage transistor having a first drain node coupled to the first input node, a first source node coupled to a termination voltage supply node, and a first termination voltage control gate coupled to receive the first termination voltage control signal; and a second termination voltage transistor having a second drain node coupled to the second input node, a second source node coupled to a termination voltage ground node, and a second termination voltage control gate coupled to receive the second termination voltage control signal.

BRIEF DESCRIPTION OF THE DRAWINGS

Accompanying drawing(s) show exemplary embodiment (s) in accordance with one or more aspects of the invention; however, the accompanying drawing(s) should not be taken to limit the invention to the embodiment(s) shown, but are for explanation and understanding only.

FIG. 7 is a circuit diagram depicting an exemplary embodiment of a conventional control signal driver circuit.

FIG. 8 is a circuit diagram depicting an exemplary embodiment of a power-down driver circuit.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Figure 1:
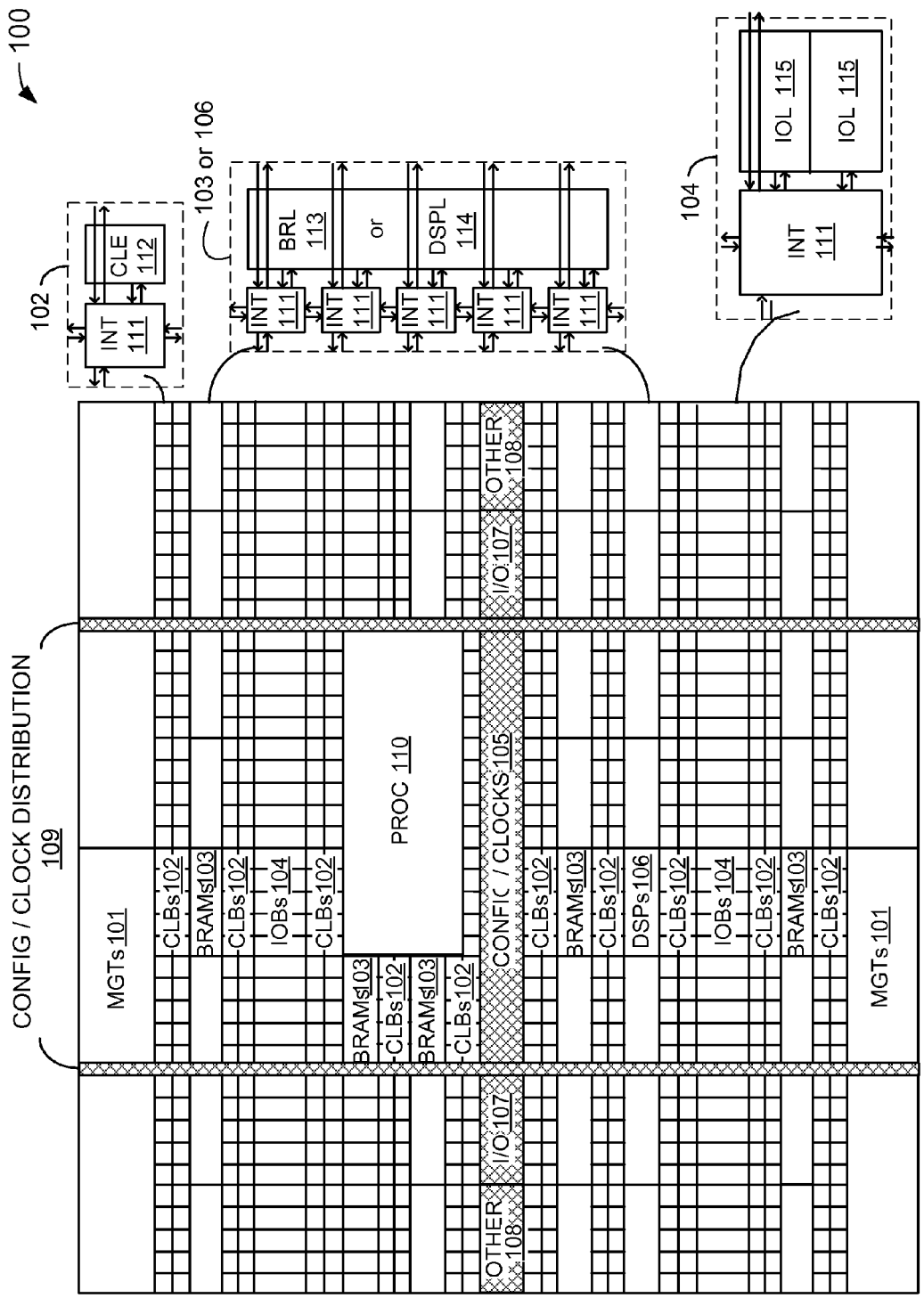
FIG. 1 is a block diagram depicting an exemplary embodiment of a columnar Field Programmable Gate Array ("FPGA") architecture in which one or more aspects of the invention may be implemented.

As noted above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a horizontal area near the center of the die (shown in FIG. 1) is used for configuration, clock, and other control logic. Vertical columns 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a horizontal column, the relative width of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

As described below in additional detail, gigabit transceivers ("GTs"), which may be MGTs 101 of FIG. 1, are individually or in combination used to provide high data rates of communication. For example, an IC may have eight GTs operating in combination for gigabyte communication. However, other numbers of GTs operating in combination may be used.

For example, each GT may be capable of operating at a data rate between approximately 155 megabits per second ("Mb/s") and approximately 6.5 gigabits per second ("Gb/s"). However, other bit rates may be used. A transmitter and a receiver of a GT may be independent circuits that use separate phase-lock loops ("PLLs") to multiply a reference frequency input by programmable numbers, where such programmable numbers range between approximately 2 and approximately 25. The result of the multiplication of such reference frequency by a programmable number results in a bit-serial data clock. Optionally, a transmitter and a receiver of a GT may share a PLL.

User definable features and parameters of a GT may be defined during configuration of an FPGA, even though such a GT is a dedicated circuit in such FPGA. Furthermore, such GT user-definable features and parameters may be modified during operation of such FPGA. Even though GTs are described in terms of being a dedicated circuit block within an FPGA, it should be appreciated that GTs described herein may be embedded in other types of ICs.

A transmitter of a GT includes a parallel-to-serial converter with a conversion ratio which is user definable. Example conversion ratios that may be set are 1 serial to 8, 10, 16, 20, 32, or 40 parallel.

A GT transmitter output may be used to drive a printed circuit board ("PCB"), with a single-channel differential current-mode logic ("CML") output signal. A transmitter clock output may be a bit-serial data clock which is divided responsive to a conversion ratio. Such a transmit output clock may be used to directly register parallel data coming from internal logic, such as field programmed programmable logic gates of an FPGA. Such incoming parallel data to a GT transmitter may be fed through a first-in, first-out buffer ("FIFO"). Optionally, incoming parallel data to a transmitter may be line encoded. Examples of line encodings that may be used are an 8-bit/10-bit line code for mapping 8 bit symbols to 10 bit symbols in order to provide a sufficient number of transitions. Other examples of line codes include a 64-bit/66-bit line code and a 64-bit/67-bit line code. Even though these known line code examples are described, it should be appreciated that other types of line codes may be used.

For a GT transmitter, a bit-serial output signal may be used to drive two package pins of an FPGA IC with complementary CML signals. Such an output signal pair may have a programmable signal swing, as well as a programmable pre-emphasis, for compensation of PCB loses and/or other signal distortions associated with interconnects and signal transmission from transmitter to receiver.

A GT receiver includes a serial-to-parallel converter. This allows a GT receiver to change an incoming bit serial differential signal into a parallel stream of words. Such words may have any of a variety of user programmable bit widths. For example, bit widths may be 8, 10, 16, 20, 32, or 40 bits wide. A GT receiver may include a programmable equalizer to compensate for PCB and/or other signal distortions associated with interconnects and signal transmission from transmitter to receiver. Accordingly, an incoming differential data stream may be fed through such a programmable equalizer for such compensation.

As previously described, a shared PLL or separate PLLs may be used to multiply a reference frequency input by any of a select number of programmable numbers, such as between approximately 2 and approximately 25. Additionally, such reference frequency input may be used to initiate clock recognition for a receive clock, such that no separate clock line or pin need be provided.

The data pattern for transmit and received data may be a non-return-to-zero ("NRZ") form or NRZ-inverted ("NRZI") form of voltage level signaling. Optionally, sufficient data transitions may be provided by using a selected encoding scheme, such as the reverse of one of the line codes previously described. From a GT receiver, parallel data may be transferred into FPGA internal logic using a receiver user clock signal. A serial-to-parallel conversion ratio may be as previously described.

GT transceivers may be used to provide out-of-band ("OOB") signaling. OOB signaling may be used to send low speed signals from a transmitter to a receiver, such as from one GT to another GT when high-speed serial data transmission is not active. Such OOB signaling may be used when a link is in a powered down state or has not been initialized. Accordingly, such OOB signaling may be used to initialize a high-speed serial data link. As will be appreciated from the following description, GTs may be provided as a modular building block for system design of a transceiver interface, where such designed system is implemented in an FPGA or other IC.

Figure 2:
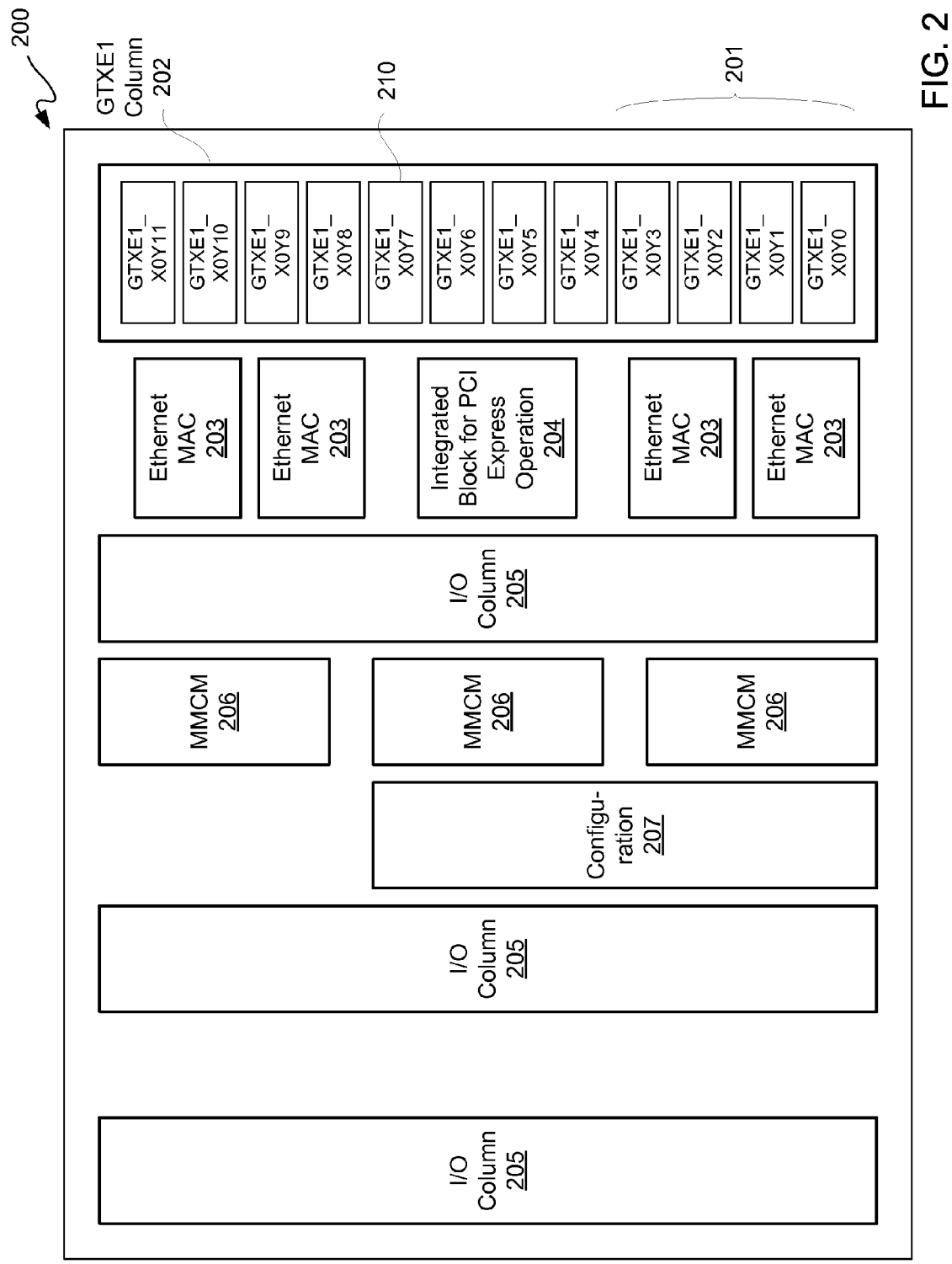
FIG. 2 is a block diagram depicting another exemplary embodiment of an FPGA.

FPGA 100 of FIG. 1 may have a column of GT transceivers such as MGT transceivers 101 of FIG. 1. Referring to FIG. 2, there is shown a block diagram depicting an exemplary embodiment of an FPGA 200. FPGA 200 includes 10 columns 205, Ethernet Media Access Controllers 203, an integrated block for PCIe operation 204, a GT column 202, a configuration block 207, and clock modules ("MMCMs") 206.

Position of a GT transceiver 210 of GT column 202 is specified by an x/y coordinate system for describing a column number and its relative position within that column. GT transceiver and clocking resources of an FPGA instantiated design may be mapped to available locations with a user constraints file ("UCF") (not shown). By defining locations of GT transceivers early in a design process, correct usage of clock resources may be facilitated, as well as facilitating signal integrity analysis during board design. Thus an implementation flow facilitates such locating of GT transceivers by use of location constraints in a UCF.

GTs 210 have dedicated clock routing and multiplexer resources. GTs 210 may be grouped in groups, such as two or four for example. An example of a grouping of four GTs 201 includes four GTXE primitives, two dedicated reference lock pin pairs, and dedicated reference clock routing is termed a "Quad," namely Quad 201. The referenced clocks of Quad 201 may be used by any of the four GTXE primitives and may be routed to top or bottom adjacent GTXE primitives using the dedicated reference clock routing.

Figure 3:
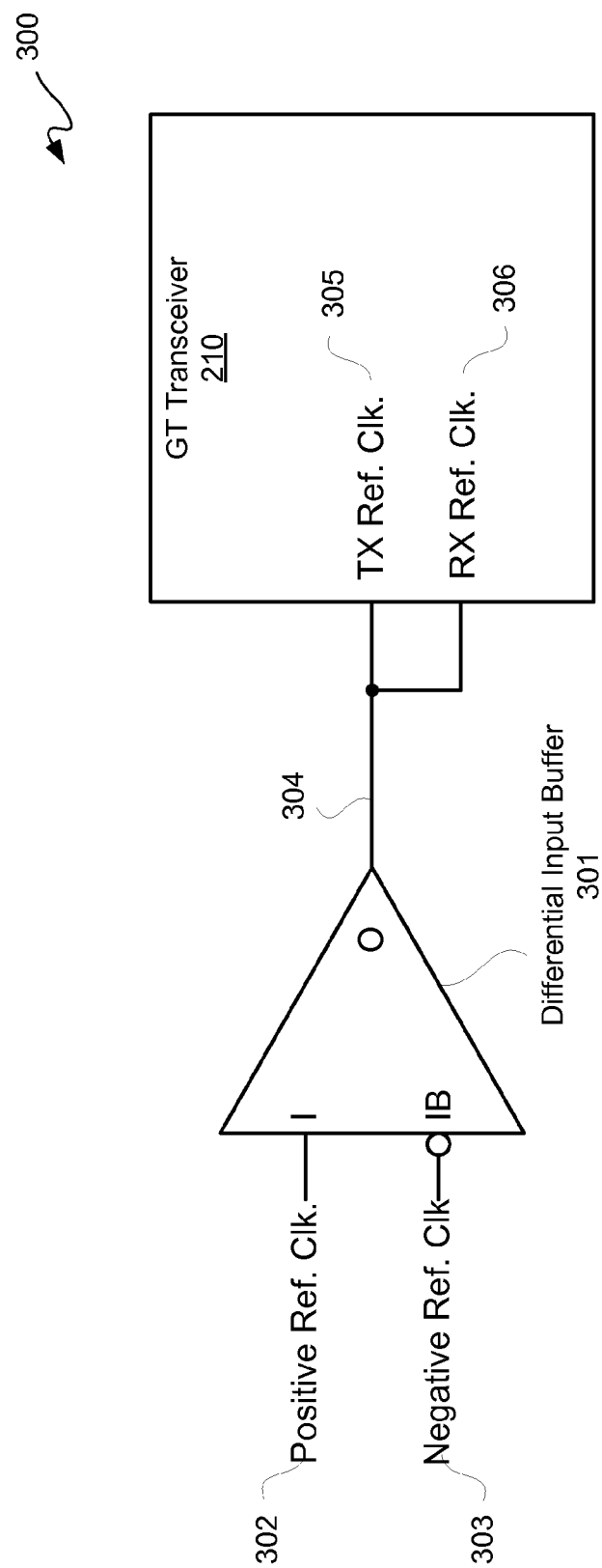
FIG. 3 is a block/circuit diagram depicting an exemplary embodiment of a single external reference clock configuration.

FIG. 3 is a block/circuit diagram depicting an exemplary embodiment of a single external reference clock configuration 300. A differential input buffer 301 is instantiated and coupled to receive positive and negative reference clocks 302 and 303, respectively, for providing a reference clock 304. Reference clock 304 is provided to a dedicated reference clock pin pair for input of a transmit ("TX") reference clock 305 and a receive ("RX") reference clock 306 of a GT 210.

As previously described, a GT may have one TX PLL and one RX PLL. TX and RX datapaths are capable of operating asynchronously using different reference clock inputs, where asynchronous signals are input. Optionally, TX and RX datapaths can operate using a same line rate range, where an RX PLL can be shared between TX and RX datapaths and the TX PLL can be powered down.

Figure 4:
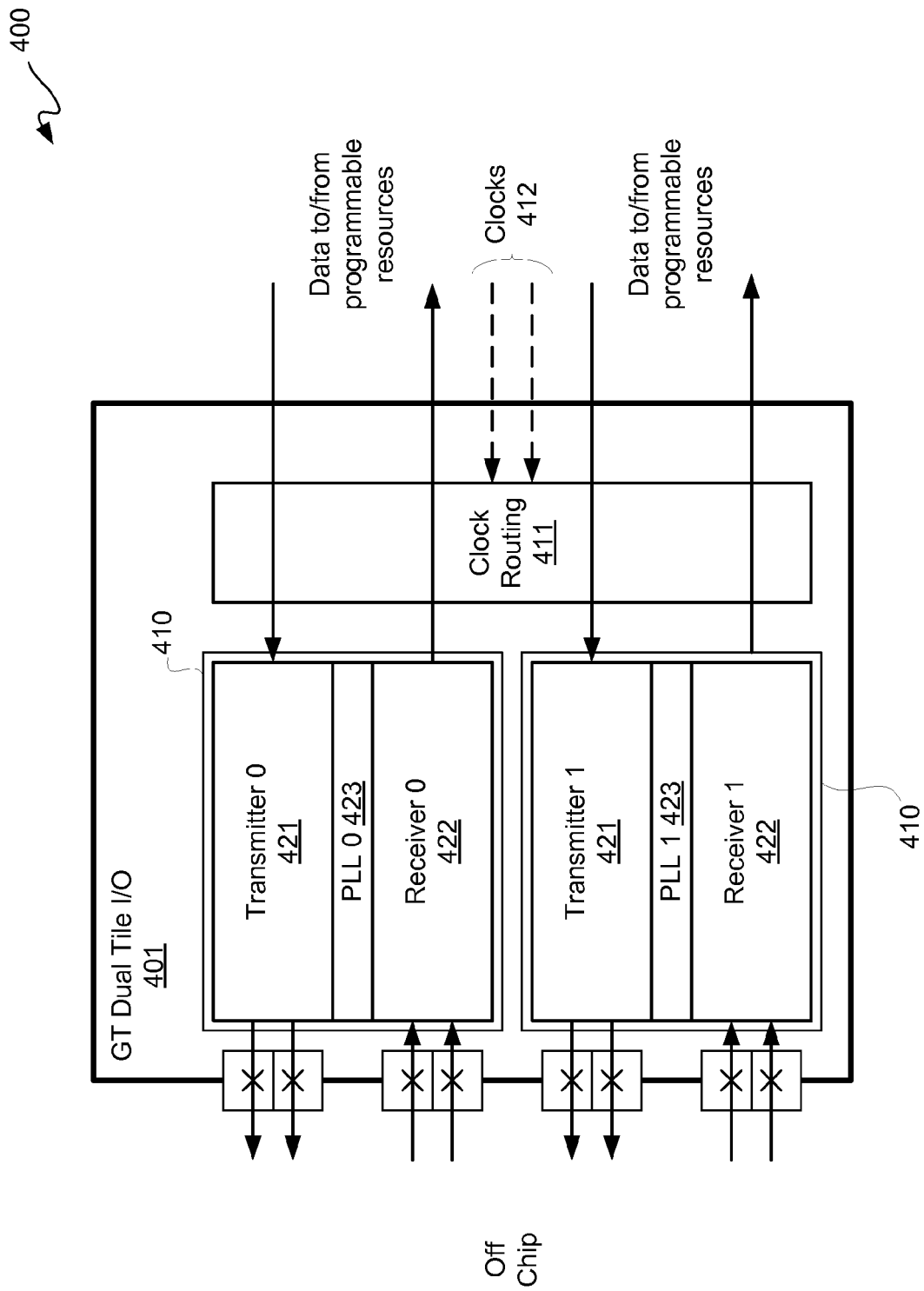
FIG. 4 is a block diagram depicting an exemplary embodiment of gigabit transceivers ("GTs") architecture.

FIG. 4 is a block diagram depicting an exemplary embodiment of a GT architecture 400. GT architecture 400 includes a GT dual tile I/O 401 having a grouping of two GT primitives 410 and a dedicated clock routing block 411. Each GT primitive 410 includes a transmitter 421, a PLL 423, and a receiver 422.

Even though a grouping of two GT primitives is illustratively shown, it should be appreciated that GT primitives may be grouped in a grouping larger than two, such as four for example. Each GT primitive 410 may be configured in one of two modes of operation. In a first mode of operation, TX and RX sides of each GT primitive 410 have one independent PLL for a total of two active PLLs for each tile 401. In a second mode of operation, TX and RX sides of both GT primitives 410 share one PLL and the second PLL of tile 401 is powered down for power savings.

Each GT primitive 410 may select from one of two reference clock inputs 412 from an FPGA. A PLL may have a nominal operating range between approximately 1.5 GHz and approximately 3.25 GHz for supporting a line rate range of approximately 3.0 to 6.5 Gb/s. However, other frequencies and bit rates may be used. A PLL output may be divided down by two or four using a clock dividers block to support a line rate range of approximately 1.5 to 3.25 Gb/s or approximately 0.75 to 1.625 Gb/s, respectively. Lower line rates may be obtained with use of an oversampling block of GT 210, where up to 5× oversampling may be obtained.

FIGS. 1 through 4 provide a context in which programmable termination as described herein may be implemented for RX termination. More particularly, differential input pads 431 and 432 coupled to a GTP receiver 422 for example provide such a context. However, it shall be appreciated from the following description that programmable termination as described herein may be employed in any IC termination application, and thus is not limited to GTP receivers of an FPGA.

To support multiple standards, a programmable termination, including a programmable RX termination, may be programmed to target resistance and common mode voltage parameters associated with a protocol. For example, a programmable RX termination may be set to be within a few ohms of a target resistance, such as 50 or 100 ohms, or set to a high resistance, namely disabled or off. Furthermore, for example, common mode voltage may be selectable over a finite set of voltages, which set may include a logic high termination voltage ("Vtt"), an analog ground voltage ("AVss"), and an electrically floating voltage ("float").

Figure 5:
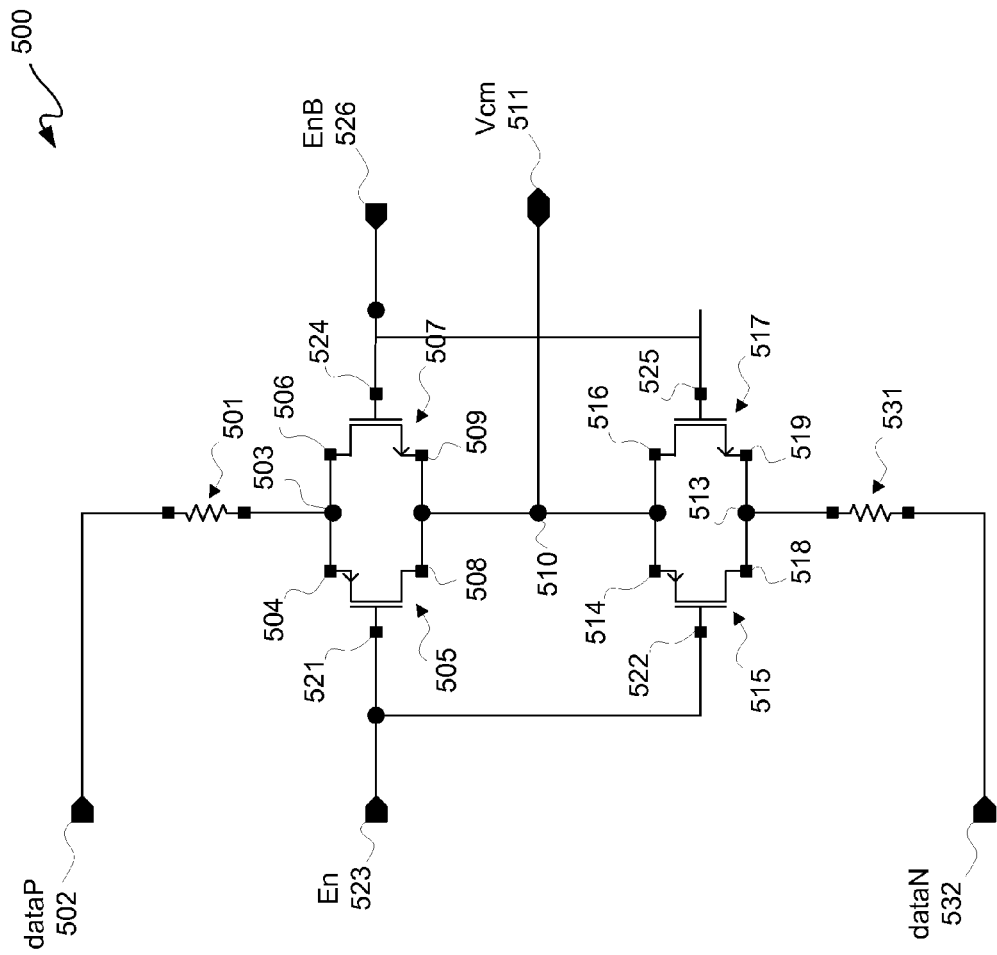
FIG. 5 is a circuit diagram depicting an exemplary embodiment of a conventional unit cell for an RX termination.

Prior to a detailed description of a novel programmable RX termination, a more thorough understanding of a conventional RX termination may be helpful. Accordingly, FIG. 5 is a circuit diagram depicting an exemplary embodiment of a conventional unit cell 500 for an RX termination. Unit cell 500 includes a resistor 501 connected to a positive side data input pad 502 and to input node 503. A source node 504 of transistor 505, which is a p-type transistor, is connected to input node 503. A drain node 506 of an n-type transistor 507 is connected to input node 503. A drain node 508 of transistor 505 and a source node 509 of transistor 507 are connected to a common mode node 510 for receiving a common mode voltage 511. Common mode voltage 511 may be for termination voltage Vtt 610 or ground AVss 612, as illustratively depicted in FIG. 6, or common mode voltage 511 may be electrically floating.

Furthermore, a p-type transistor 515 has its source node 514 connected to common mode voltage node 510, and an n-type transistor 517 has its drain node 516 connected to common mode voltage node 510. A drain node 518 of p-type transistor 515 and a source node 519 of n-type transistor 517 are connected to an input node 513.

Gate nodes 521 and 522 respectively of p-type transistors 505 and 515 are coupled to receive an enable signal 523. Gate nodes 524 and 525 respectively of n-type transistors 507 and 517 are coupled to receive an enable bar signal 526. A resistor 531 is coupled between input node 513 and a negative side data input pad 532. Accordingly, it should be understood that because enable signal 523 and enable bar signal 526 are complementary signals and are applied to gates of transistors having opposite polarity, transistors 505, 515, 507, and 517 are all put in a substantially conductive state ("ON" or "ON state") or in a substantially nonconductive state ("OFF" or "OFF state"). If enable signal 523 is logic high and enable bar signal 526 is thus logic low, unit cell 500 is disabled, namely put in a high resistance state, which is sometimes referred to as a tri-state. If, however, enable signal 523 is logic low and enable bar signal 526 is thus logic high, parallel turn on resistances of transistor pair 505 and 507 and transistor pair 515 and 517 are put in series with resistances of resistors 501 and 531. Thus, data input may be terminated to a common mode node 510 for output node 605. Unit cells 500 may be coupled in parallel in order to provide a termination circuit, where states of transistors of such unit cells 500 may be used to trim resistance with each of nodes 510 coupled to one another, such as to meet a termination resistance of a protocol.

Figure 6:
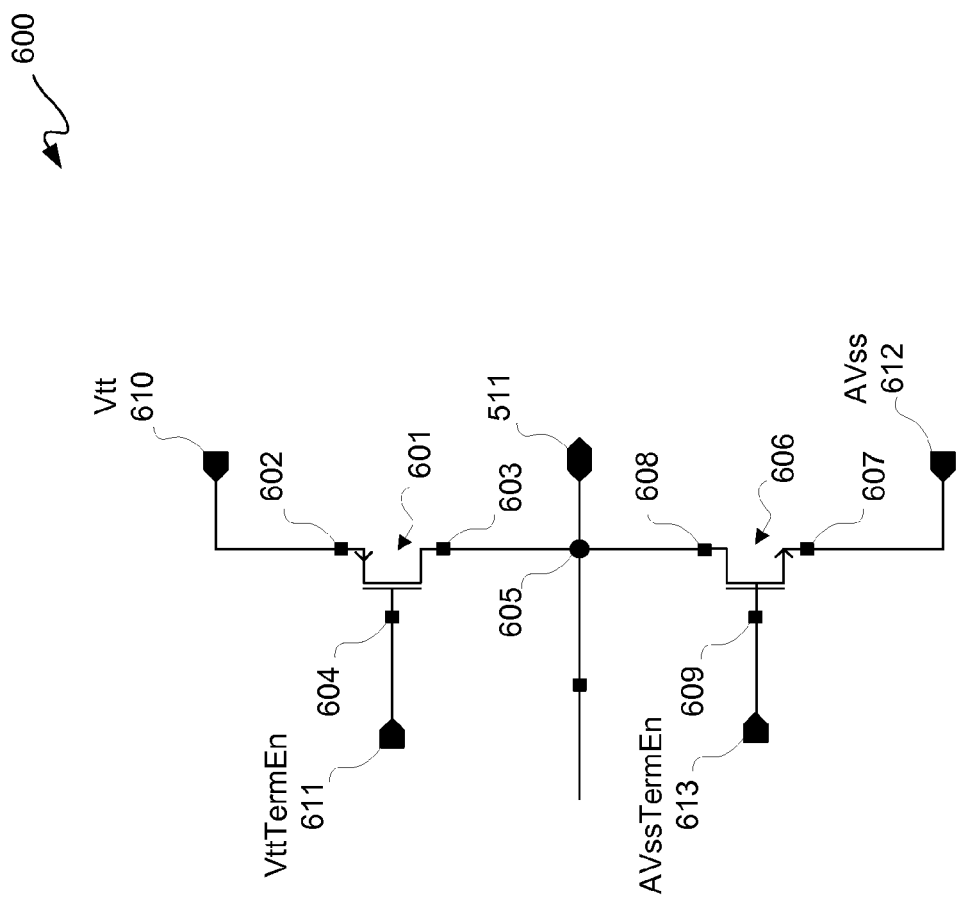
FIG. 6 is a circuit diagram depicting an exemplary embodiment of a conventional driver circuit.

With reference to FIG. 6, there is shown a circuit diagram depicting an exemplary embodiment of a conventional driver circuit 600. Driver circuit 600 may be used for terminating common mode voltage 511. A p-type transistor 601 has a source node 602 coupled to receive a logic high termination voltage Vtt 610. Conventionally, Vtt 610 is in a range of approximately 1.0 to 1.5 volts. A drain node 603 of p-type transistor 601 is coupled to an output node 605 from which common mode voltage 511 may be sourced. In other words, output node 605 may be thought of as common mode voltage node 510 of FIG. 5. It should be understood that transistors 601 and 606 of FIG. 6 are large MOS transistors, in comparison with CMOS transistors 505 and 507 of FIG. 5 for example.

A gate node 604 of p-type transistor 601 is coupled to receive a Vtt termination enable signal 611. An n-type transistor 606 has its drain node 608 connected to output node 605. A source node 607 of n-type transistor 606 is connected to a logic low termination voltage AVss 612. Conventionally, AVss 612 is at least approximately 0 volts. A gate node 609 of n-type transistor 606 is coupled to receive AVss termination enable signal 613. Termination enable signals 611 and 613 are not complementary signals. If Vtt termination enable signal 611 is active, p-type transistor 601 is in an ON state for conducting Vtt 610 to output node 605, and AVss termination enable signal 613 is not active so transistor 606 is in an OFF state. If, however, AVss termination enable signal 613 is active or asserted, then Vtt termination enable signal 611 is not active or not asserted. Accordingly, in such a condition, n-type transistor 606 would be in an ON state for electrically coupling AVss 612 to output node 605, and p-type transistor 601 would be in an OFF state. Furthermore, it should be understood that neither termination enable signal 611 nor termination enable signal 613 may be asserted.

If neither of termination enable signals 611 and 613 is asserted, then output node 605 is allowed to electrically float. Furthermore, it should be understood that output node 605 may be either electrically floated, coupled to Vtt 610, or coupled to AVss 612.

FIG. 7 is a circuit diagram depicting an exemplary embodiment of a conventional control signal driver circuit 700. Resistance selection is performed with power-down and resistance control signals, as well as their corresponding complement signals. More particularly, a power-down bar signal ("pwrdnHB") 701 may be input to a NAND gate 710. NAND gate 710 may be biased between Vtt 610 and AVss 612. Furthermore, a resistance control signal ("rCtrlH, 4:0>") 702 may be input to NAND gate 710. In this exemplary embodiment resistance control signal 702 is a 5-bit signal; however, fewer or more than 5 bits may be used depending on the degree of resistance programmability.

For trimming resistance, power-down bar signal 701 is not asserted and resistance control signal 702 is asserted. Accordingly, in such condition, output of NAND gate 710 is resistance control bar signal 703, which is provided as an input to driver or inverter 750. Output of inverter 750, which may be biased between Vtt 610 and AVss 612, is resistance control signal 702 for power-down bar signal 701 not being asserted. Additional inverters 750 may be coupled in series as generally indicated by ellipsis 720 for providing taps for control signal 702 and control bar signal 703. If, however, power down bar signal 701 is asserted, namely logic low, then output of NAND gate 710 is power down signal 801, and output of inverter 750 is power down bar signal 701.

FIG. 8 is a circuit diagram depicting an exemplary embodiment of a power-down driver circuit 800. Power-down driver circuit 800 receives power-down bar signal 701 as an input to inverter 751. Inverter 751 may be biased between Vtt 610 and AVss 612. Output of inverter 751 is power-down signal 801. Power-down signal 801 may be provided as an input to another inverter 752. Inverter 752 may be biased between Vtt 610 and AVss 612, and output of inverter 752 is power-down bar signal 701.

Accordingly, with reference to FIGS. 5 through 8, a conventional unit cell, and driver circuits therefor, have been described. It should be appreciated that control and power-down signals, as well as their complements, may be used for setting state of termination. In other words, bits of control and control bar signals 702 and 703 are enable and enable bar signals 523 and 526, respectively, for all conventional unit cells 500 in parallel other than an initial or first of such unit cells 500. Power-down and power-down bar signals 801 and 701 are inactive during resistance trimming, and such ohmic trimming is done responsive to a code set by bits of resistance control signal 702. In other words, a bit of resistance control signal 702 and a bit of resistance control bar signal 703 implement resistance of a unit cell 500 of FIG. 5 unit cells 500 coupled in parallel, as described below in additional detail with reference to FIG. 9. However, power-down and power-down bar signals 801 and 701 are active as enable and enable bar signals 523 and 526, respectively, to electrically activate a first unit cell 500 of parallel unit cells 500, as a lowest termination resistance.

Figure 9:
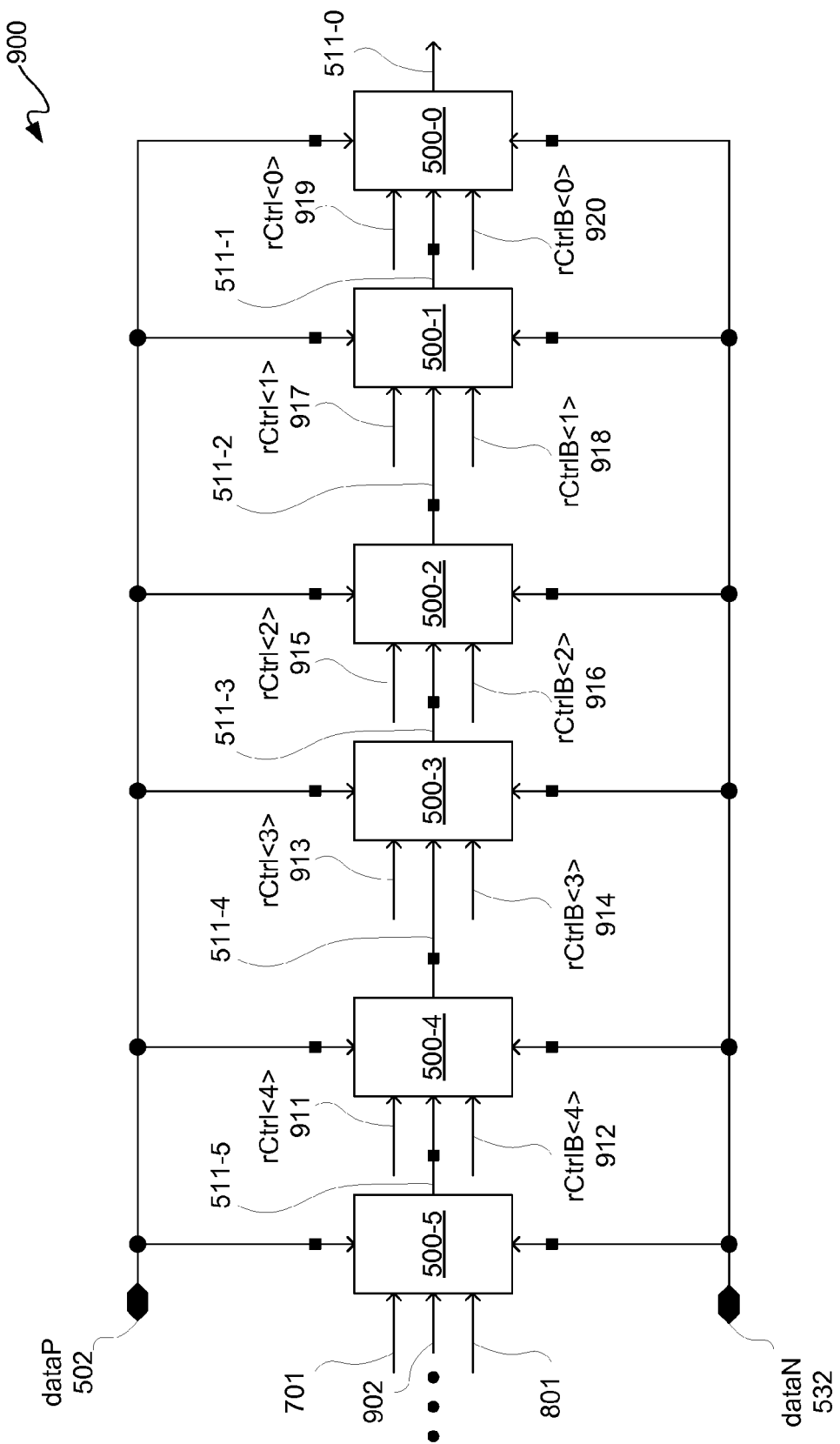
FIG. 9 is a block diagram depicting an exemplary embodiment of a conventional parallel termination circuit.

FIG. 9 is a block diagram depicting an exemplary embodiment of a conventional parallel termination circuit 900. Parallel termination circuit 900 includes unit cells 500-0 through 500-5 ("unit cells 500"). However, fewer or more than six unit cells 500 may be implemented depending on the degree of resistance trimming. It should be understood that a leftmost unit cell 500-5 is active for a low termination resistance (e.g., multiplied by 1 or "1×"), and the successive addition of each unit cell 500 to the right of unit cell 500-5 may be a multiple thereof (e.g., 2×, 4×, 8×, 16×, and 32× for this exemplary embodiment). Thus, in this exemplary embodiment, a lowest termination resistance for parallel termination circuit 900 when at least one unit cell is active is when only unit cell 500-5 is active. Moreover, in this exemplary embodiment, a highest termination resistance for parallel termination circuit 900 is when all of unit cells 500 are active.

Power-down bar signal 701 may be input to unit cell 500-5 as an enable signal 523. Moreover, power-down signal 801 may be input to unit cell 500-5 as enable bar signal 526. An additional input, namely common mode voltage input 902, may also be provided to unit cell 500-5. For the exemplary embodiment of a 5-bit control input, common mode voltage input 902 may be omitted.

As previously described with reference to FIG. 5, a unit cell 500 receives data from data positive pad side 502 and data negative pad side 532 as inputs. For unit cells 500 in parallel, each unit cell thereof is coupled to receive data from data positive pad side 502 and data negative pad side 532 as inputs.

Output of unit cell 500-5 is common mode voltage 511-5 which is provided as a common mode voltage input to node 510 of unit cell 500-4. Unit cell 500-4 receives resistance control signal 911 and resistance control bar signal 912 respectively as enable and enable bar signals, respectively. Control signals 911 and 912 represent the fourth bit of resistance control signal 702 and resistance control bar signal 703, respectively. Unit cell 500-4 provides a common mode voltage output 511-4. Common mode voltage 511-4 is provided as a common mode voltage input to node 510 of unit cell 500-3.

Control signals 913 and 914 represent the third bit of resistance control signal 702 and resistance control bar signal 703, respectively. Unit cell 500-3 receives resistance control signal 913 and resistance control bar signal 914 as enable and enable bar control signals 523 and 526 thereof, respectively, as well as common mode voltage 511-4 at node 510 thereof, and unit cell 500-3 provides common mode voltage 511-3.

Control signals 915 and 916 represent the second bit of resistance control signal 702 and resistance control bar signal 703, respectively. Unit cell 500-2 receives resistance control signal 915 and resistance control bar signal 916 as enable and enable bar control signals 523 and 526 thereof, respectively, as well as common mode voltage 511-3 at node 510 thereof, and unit cell 500-2 provides common mode voltage 511-2.

Control signals 917 and 918 represent the first bit of resistance control signal 702 and resistance control bar signal 703, respectively. Unit cell 500-1 receives resistance control signal 917 and resistance control bar signal 918 as enable and enable bar control signals 523 and 526 thereof, respectively, as well as common mode voltage 511-2 at node 510 thereof, and unit cell 500-1 provides common mode voltage 511-1

Control signals 919 and 920 represent the zeroth bit of resistance control signal 702 and resistance control bar signal 703, respectively. Unit cell 500-0 receives resistance control signal 919 and resistance control bar signal 920 as enable and enable bar control signals 523 and 526 thereof, respectively, as well as common mode voltage 511-1 at node 510 thereof, and unit cell 500-0 provides common mode voltage 511-0.

Common mode voltage 511-0 may be input to input node 605 of driver 600 of FIG. 6 for providing common mode voltage 511. Accordingly, it should be understood that from node 605, Vtt 610, AVss 612, or a common mode voltage 511 may be sourced. With respect to the last state, it should be understood that for an OFF resistance between data on data positive side 502 and data negative side 532 and VCM 511, all branches of parallel termination circuit 900 may be turned off by assertion of power-down signal 701. The assertion of power-down signal 701 deactivates or disables resistance control signal 702 via NAND gate 710.

Accordingly, it should be understood that effectively resistance may be trimmed for providing a common mode voltage at node 605 for a protocol. Furthermore, it should be understood that node 605 may be electrically coupled to AVss 612 or Vtt 610. However, there is a significant amount of routing and circuitry associated with such conventional implementation. Such additional routing creates parasitics, including parasitic capacitance, which significantly negatively impacts performance, such as return loss and bandwidth at high frequency. As described below in additional detail with reference to FIGS. 10 and 11, a more compact programmable termination circuit is described which has less routing, as well as less parasitics associated therewith, and accordingly has better performance at high frequencies than the conventional implementation as described with reference to FIGS. 6 through 9.

Figure 10:
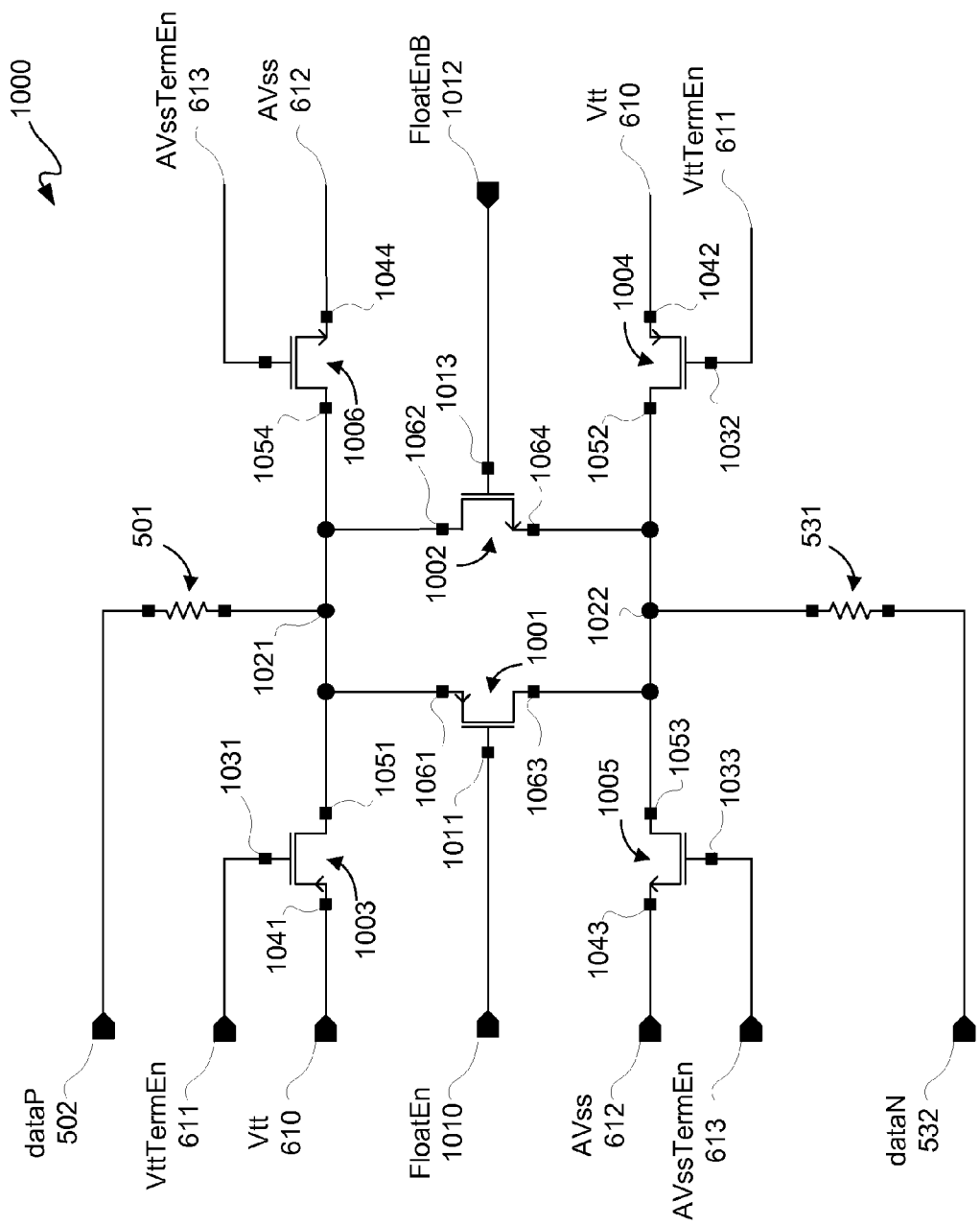
FIG. 10 is a circuit diagram depicting an exemplary embodiment of a unit cell for a programmable termination circuit.
Figure 11:
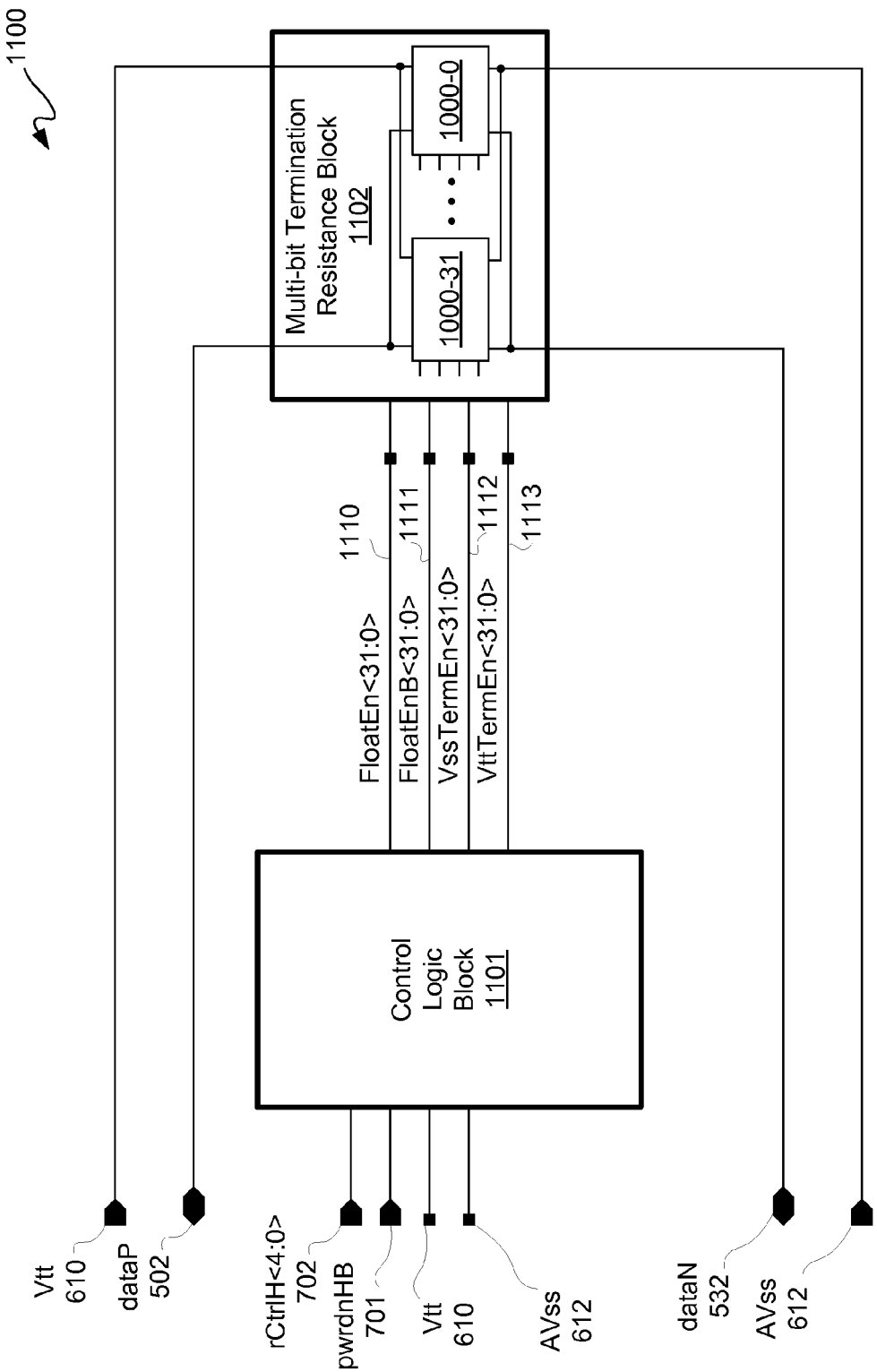
FIG. 11 is a block diagram depicting an exemplary embodiment of a programmable termination circuit.

FIG. 10 is a circuit diagram depicting an exemplary embodiment of a unit cell 1000 for a programmable termination circuit. FIG. 11 is a block diagram depicting an exemplary embodiment of a programmable termination circuit 1100. With simultaneous reference to FIGS. 10 and 11, unit cell 1000 and programmable termination circuit 1100 are further described.

Unit cell 1000 includes transistors 1001 through 1006. Transistors 1001, 1003, and 1004 in this exemplary embodiment are p-type transistors, and transistors 1002, 1005, and 1006 in this exemplary embodiment are n-type transistors. However, it will be understood from the following description that opposite polarity may be used.

A float enable control signal 1010 is provided to a gate node 1011 of transistor 1001. Float enable bar control signal 1012 is provided to a gate node 1013 of transistor 1002. Control signals 1010 and 1012 are complementary signals.

Positive side data input 502 is provided to resistor 501, and negative side data input 532 is provided to resistor 531. Resistor 501 is connected to input node 1021, and resistor 531 is connected to input node 1022.

Vtt termination enable control signal 611 is provided to a gate node 1031 of transistor 1003 and to a gate node 1032 of transistor 1004. AVss termination enable control signal 613 is provided to a gate node 1033 of transistor 1005 and to a gate node 1034 of transistor 1006. A source node 1041 of transistor 1003 and a source node 1042 of transistor 1004 are each coupled to receive a termination voltage Vtt 610, namely coupled to a Vtt supply voltage node 610.

A source node 1043 of transistor 1005 is coupled to receive a termination voltage AVss 612, namely coupled to a ground node or ground 612. Likewise, a source node 1044 of transistor 1006 is coupled to receive termination voltage AVss 612. A drain node 1051 of transistor 1003 and a drain node 1054 of transistor 1006 are connected to one another and to input node 1021. A drain node 1053 of transistor 1005 and a drain node 1052 of transistor 1004 are connected to one another and to input node 1022. A source node 1061 of transistor 1001 is connected to input node 1021, and a drain node 1062 of transistor 1002 is connected to input node 1021. A drain node 1063 of transistor 1001 is connected to input node 1022, and a source node 1064 of transistor 1002 is connected to input node 1022.

Programmable termination circuit 1100 includes a control circuit such as, e.g., control logic block 1101 and a multiple bit termination resistance block 1102. A resistance control signal bus 702, a power-down bar signal 701, a termination voltage Vtt 610, and a termination voltage AVss 612 are provided to control logic block 1101. Control logic block 1101 provides float enable signals or bus 1110, float enable bar signals or bus 1111, AVss termination enable signals or bus 1112, and Vtt termination enable signals or bus 1113 to multi-bit termination resistance block 1102 responsive to resistance control signal 702 and power-down signal 701. Again for this particular embodiment, resistance control signal bus 702 is a 5-bit bus; however, fewer or more bits may be used depending on degree of trimming capability.

In this exemplary embodiment, a float enable bus 1110, float enable bar bus 1111, AVss termination enable bus 1112, and Vtt termination bus 1113 are all 32-bit buses; however, fewer or more bits may be used. Accordingly, float enable bus 1110 carries float enable control signals 1010, float enable bar bus 1111 carries float enable bar control signals 1012, AVss termination enable bus 1112 carries AVss termination enable control signals 613, and Vtt termination enable bus 1113 carries Vtt termination enable control signals 611.

For this exemplary embodiment, multi-bit termination resistance block 1102 includes 32 unit cells 1000-0 through 1000-31 ("unit cells 1000"). Each unit cell receives a respective control signal via control signal buses 1110 through 1113. It should be understood that fewer or more than 32 unit cells may be implemented.

Each of unit cells 1000 of multi-bit termination resistance block 1102 is coupled to receive data from positive side data input 502 and negative side data input 532, as may respectively associated with differential data input pads as previously described. Unit cells 1000 of multi-bit termination resistance block 1002 may be coupled in parallel with one another, and a set of control signals 1010, 1012, 613, and 611 for a respective bit position associated with a unit cell 1000 may be provided thereto for each of unit cells 1000.

Even though unit cells 1000 have two more transistors than a conventional unit cell 500 of FIG. 5, it should be understood that a parallelized array of unit cells 1000 forms a programmable termination array, namely multi-bit termination resistance block 1102, with significantly less routing than conventional parallel termination circuit 900 of FIG. 9 and without the relatively large conventional driver circuit 600 of FIG. 6.

Moreover, additional functionality provided by multi-bit termination resistance block 1102 in combination with control logic block 1101 reduces overall circuit footprint. In other words, programmable termination circuit 1100 can be formed in a more compact design than conventional programmable termination circuit 900 of FIG. 9. This is because unit cell 1000 uses a single transistor to implement both functions of trimming and common mode voltage, in contrast to using a transmission gate for trimming and a separately large transistor for common mode voltage, as previously described with reference to FIGS. 5 through 9. In contrast, as illustratively depicted in FIGS. 10 and 11, both trimming and voltage termination are done locally at the unit cell level of unit cells 1000. A trimming value parameter is based on an appropriate number of parallelized unit cells as selected by control logic block 1101.

Figure 12:
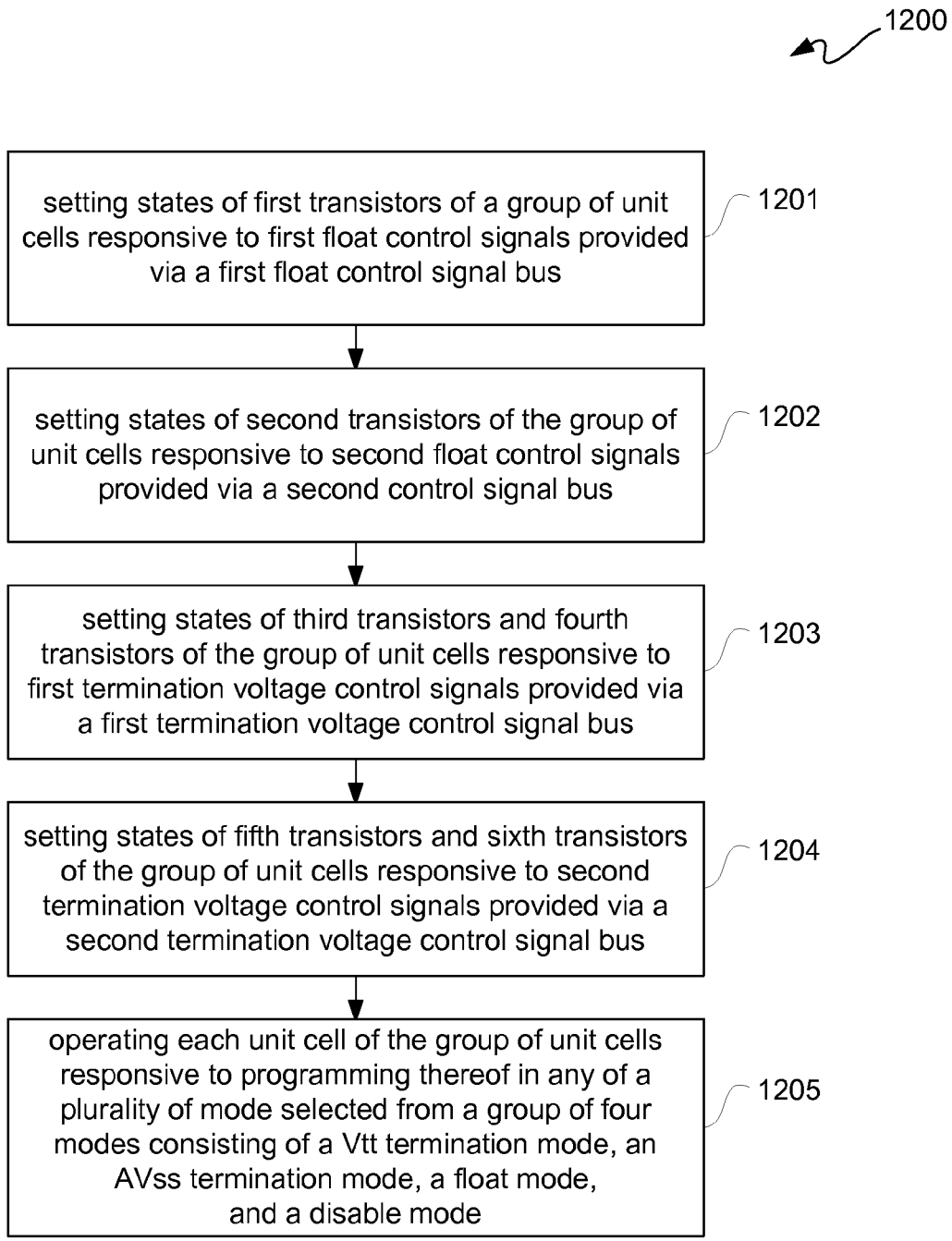
FIG. 12 is a flow diagram depicting an exemplary embodiment of a programming flow.

FIG. 12 is a flow diagram depicting an exemplary embodiment of a programming flow 1200. Programming flow 1200 may be for setting states of transistors of unit cells 1000-0 through 1000-31 of FIG. 11. With simultaneous reference to FIGS. 10 through 12, programming flow 1200 is further described.

At 1201, states of first transistors of a group of unit cells, such as transistors 1001 of unit cells 1000-0 through 1000-31, are set responsive to first float control signals, such as float enable signals 1010 provided via float enable bus 1110. At 1202, states of second transistors of the group of unit cells, such as transistors 1002 of unit cells 1000-0 through 1000-31, are set responsive to second float control signals provided via a second control signal bus, such as float enable bar signals 1012 provided via float enable bar bus 1111.

At 1203, states of third transistors and fourth transistors of the group of unit cells, such as transistors 1003 and 1004, respectively, of unit cells 1000-0 through 1000-31, are set responsive to first termination voltage control signals provided via first termination voltage control bus, such as Vtt termination enable signal 611 provided via Vtt termination enable bus 1113. At 1204, states of fifth and sixth transistors of the group of unit cells, such as transistors 1005 and 1006, respectively, of unit cells 1000-0 through 1000-31, are set responsive to second termination voltage control signals provided via a second termination voltage control signal bus, such as AVss termination enable signals 613 provided via AVss termination enable bus 1112.

It should be appreciated that operations performed at 1201 through 1204 may all be performed concurrently for programming the group of unit cells, such as unit cells 1000-0 through 1000-31, for operating each such unit cell in such group of unit cells. Each of the unit cells may be set to any of a plurality of modes selected from a group of four modes at 1205. The four modes are: a Vtt termination mode 1301, a AVss termination mode 1401, a float mode 1501, and a disable mode 1601, respectively of FIGS. 13 through 16. With ongoing reference to FIGS. 10 through 12, programming of these four modes is described in additional detail with references to FIGS. 13 through 16.

Figure 13:
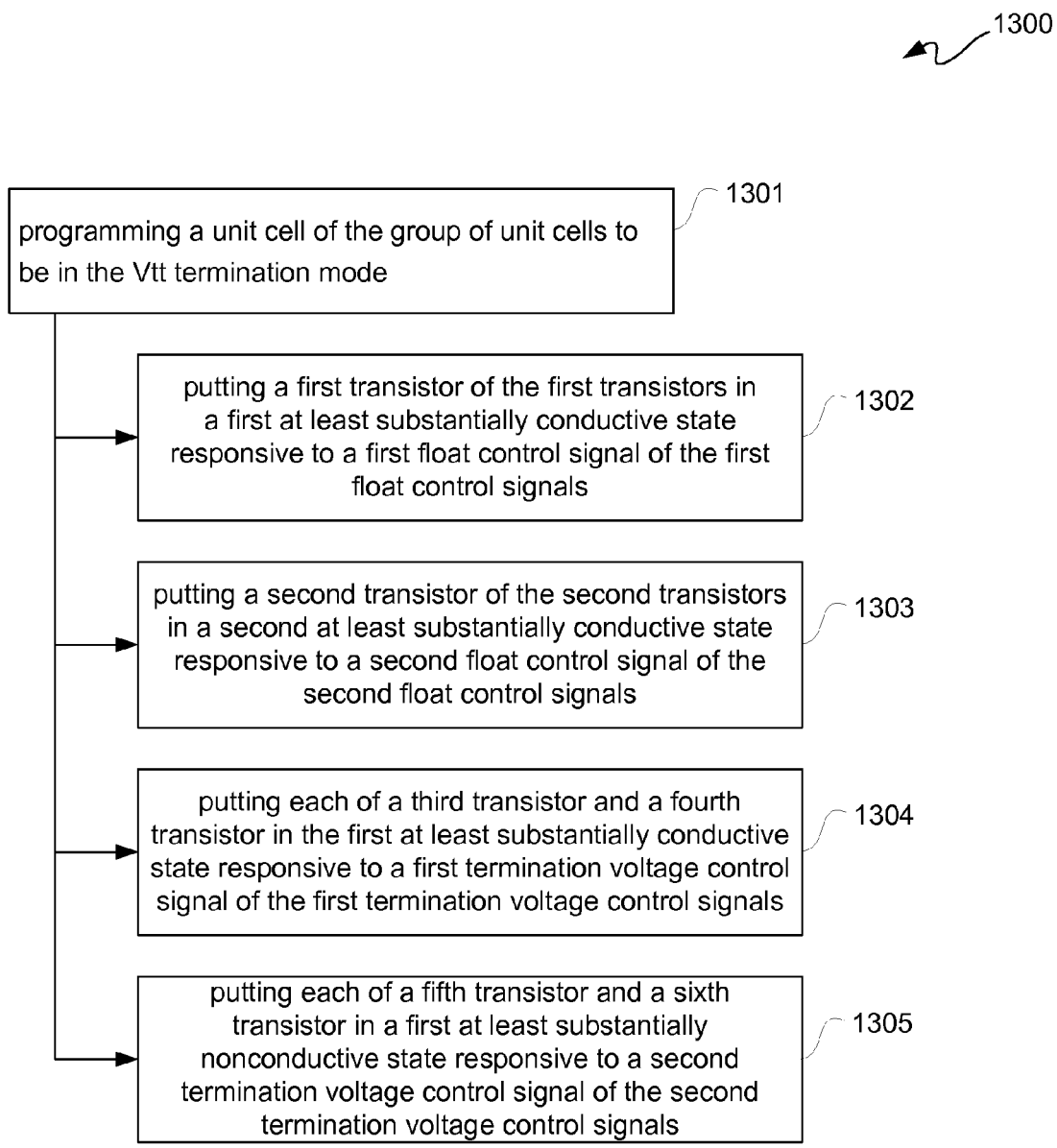
FIG. 13 is a flow diagram depicting an exemplary embodiment of a Vtt termination mode programming flow.

FIG. 13 is a flow diagram depicting an exemplary embodiment of a Vtt termination mode programming flow 1300. At 1301, a unit cell of the group of unit cells, such as unit cells 1000-0 through 1000-32, is programmed to be in a Vtt termination mode. Such termination mode programming may include operations at 1302 through 1304, which operations may all be performed concurrently.

At 1302, a first transistor of the first transistors for the unit cell programmed at 1301, such as transistor 1001, is put in a first at least substantially conductive state responsive to a first float control signal of the first float control signals, such as float enable signal 1010 provided via float enable bus 1110. By a first at least substantially conductive state, it is generally meant a state of p-type transistor 1001 where a p-channel is provided for conducting between source and drain nodes, namely an ON state.

At 1303, a second transistor, such as transistor 1002, of the unit cell to be programmed at 1301 is put in a second at least substantially conductive state responsive to a second float control signal of second float control signals. Again, it should be understood that the second float control signal may be float enable bar signal 1012 which provided as part of a group of float enable bar signals via float enable bar bus 1111. Furthermore, it should be understood that the second transistor at 1303 is for the unit cell programmed at 1301, which is a unit cell of a group of unit cells, such as unit cells 1000-0 through 1000-31. By a second at least substantially conductive state, it is generally meant a state of n-type transistor 1002, where an n-channel is provided for conducting between source and drain via such n-channel, namely an ON state.

At 1304, each of a third transistor, such as transistor 1003, and fourth transistor, such as transistor 1004, are put in the first at least substantially conductive state responsive a first termination voltage control signal, such as Vtt termination enable signal 611, of a first termination voltage control signals, such as Vtt termination enable control signals provided Vtt termination enable bus 1113.

At 1305, each of a fifth transistor, such as transistor 1005, and a sixth transistor, such as transistor 1006, are put in a first at least substantially nonconductive state responsive to a second termination voltage control signal, such as AVss termination enable signal 613, of second termination voltage control signals, such as provided via AVss termination enable bus 1112. By a first at least substantially nonconductive state, it is generally meant a state of n-type transistors 1005 and 1006 where an n-channel is not provided for conducting from source to drain, namely an OFF state. Such an OFF state occurs, when AVss termination enable signal 613 is inactive logic low.

Accordingly, it should be understood that for programming a unit cell 1000 to be in a Vtt termination mode, AVss termination enable signal 613 may be active logic low, and AVss termination enable signal 613 may be inactive logic low, and float enable signal 1010 may be active logic low and float enable bar signal 1012 may be active logic high. In such state, transistors 1001 through 1004 are all ON, and transistors 1005 and 1006 are both OFF.

Figure 14:
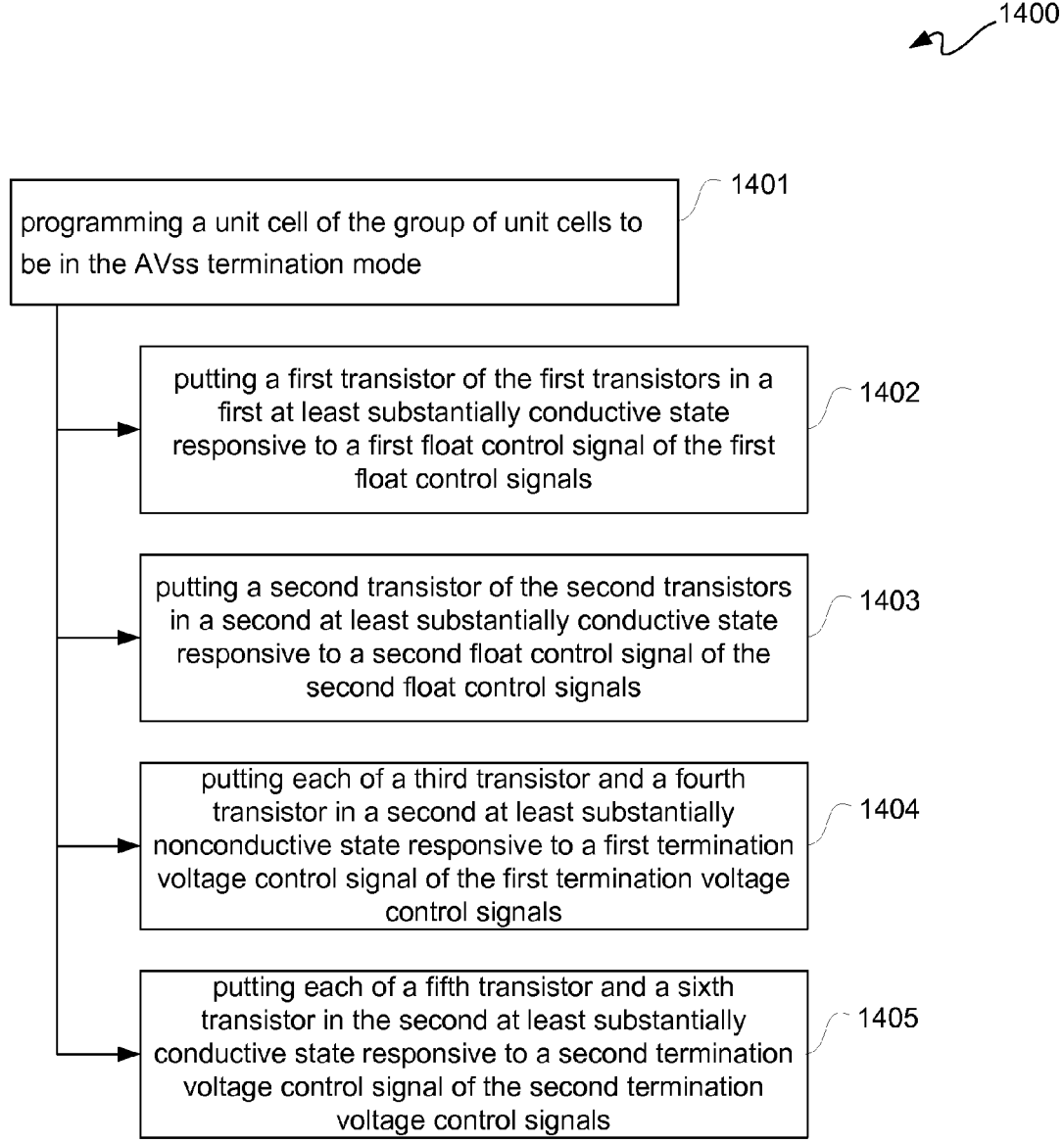
FIG. 14 is a flow diagram depicting an exemplary embodiment of AVss termination mode programming flow.

FIG. 14 is a flow diagram depicting an exemplary embodiment of AVss termination mode programming flow 1400. At 1401, a unit cell, such as unit cell 1000, of a group of unit cells, such as unit cells 1000-0 through 1000-31, is programmed to be in an AVss termination mode. Programming AVss termination mode at 1401 may include operations 1402 through 1405. Operations 1402 through 1405 may all be performed concurrently.

Operations 1402 and 1403 are the same as operations 1302 and 1303, respectively of FIG. 13, and thus their description is not repeated. At 1404, each of a third transistor, such as transistor 1003, and a fourth transistor, such as transistor 1004, are put in a second at least substantially nonconductive state responsive to a first termination voltage control signal of first termination voltage control signals. Such first termination voltage control signal may be Vtt termination enable signal 611, which may be provided with other Vtt termination enable control signals 611 via Vtt termination enable bus 1113. By a second at least substantially nonconductive state of a p-type transistor, such as p-type transistors 1003 and 1004 at 1404, it is generally meant that a p-channel is not provided, namely an OFF state. Such an OFF state occurs, when Vtt termination enable signal 611 is inactive logic high.

At 1405, each of a fifth transistor, such as transistor 1005, and a sixth transistor, such as transistor 1006, are put in a second at least substantially conductive state responsive to a second termination voltage control signal, such as AVss termination enable signal 613, of second termination voltage control signals, such as AVss termination enable signal 613 provided via AVss termination enable bus 1112. Accordingly, for a AVss termination mode, transistors 1001, 1002, 1005, and 1006 are all in an ON state, and transistors 1003 and 1004 are both in an OFF state.

Figure 15:
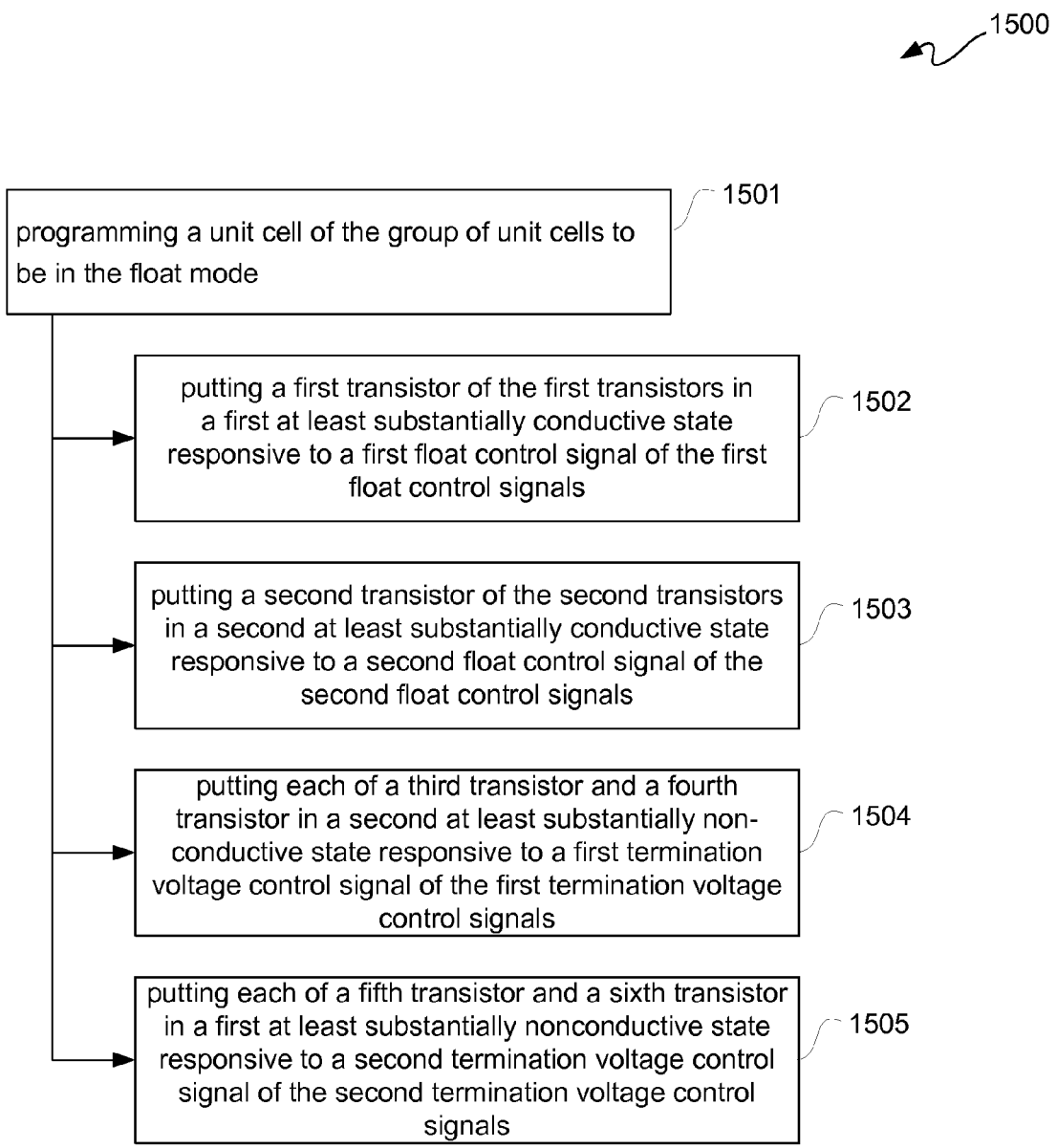
FIG. 15 is a flow diagram depicting an exemplary embodiment of a float mode programming flow.

FIG. 15 is a flow diagram depicting an exemplary embodiment of a float mode programming flow 1500. A unit cell, such as unit cell 1000, of a group of unit cells, such as unit cells 1000-0 through 1000-31, is programmed at 1501 to be in a float mode. To program unit cell 1000 to be in a float mode at 1501, operations at 1502 through 1505 may be performed. Operations at 1502 through 1505 may all be performed concurrently.

Operations at 1502 and 1503 are the same as those operations at 1302 and 1303 of FIG. 13, and thus their description is not repeated. Furthermore, operations at 1504 and at 1404 of FIG. 14 are the same, and description of such operations is not repeated. Lastly, operations at 1505 and at 1305 of FIG. 13 are the same, and accordingly such description is not repeated.

For a float mode, Vtt termination enable signal 611 is inactive logic high and AVss termination enable signal 613 is inactive logic low, and float enable signal 1010 is active logic low and float enable bar signal is active logic high. Thus, transistors 1001 and 1002 are both in an ON state, and transistors 1003 through 1006 are all in an OFF state, for a float mode.

Figure 16:
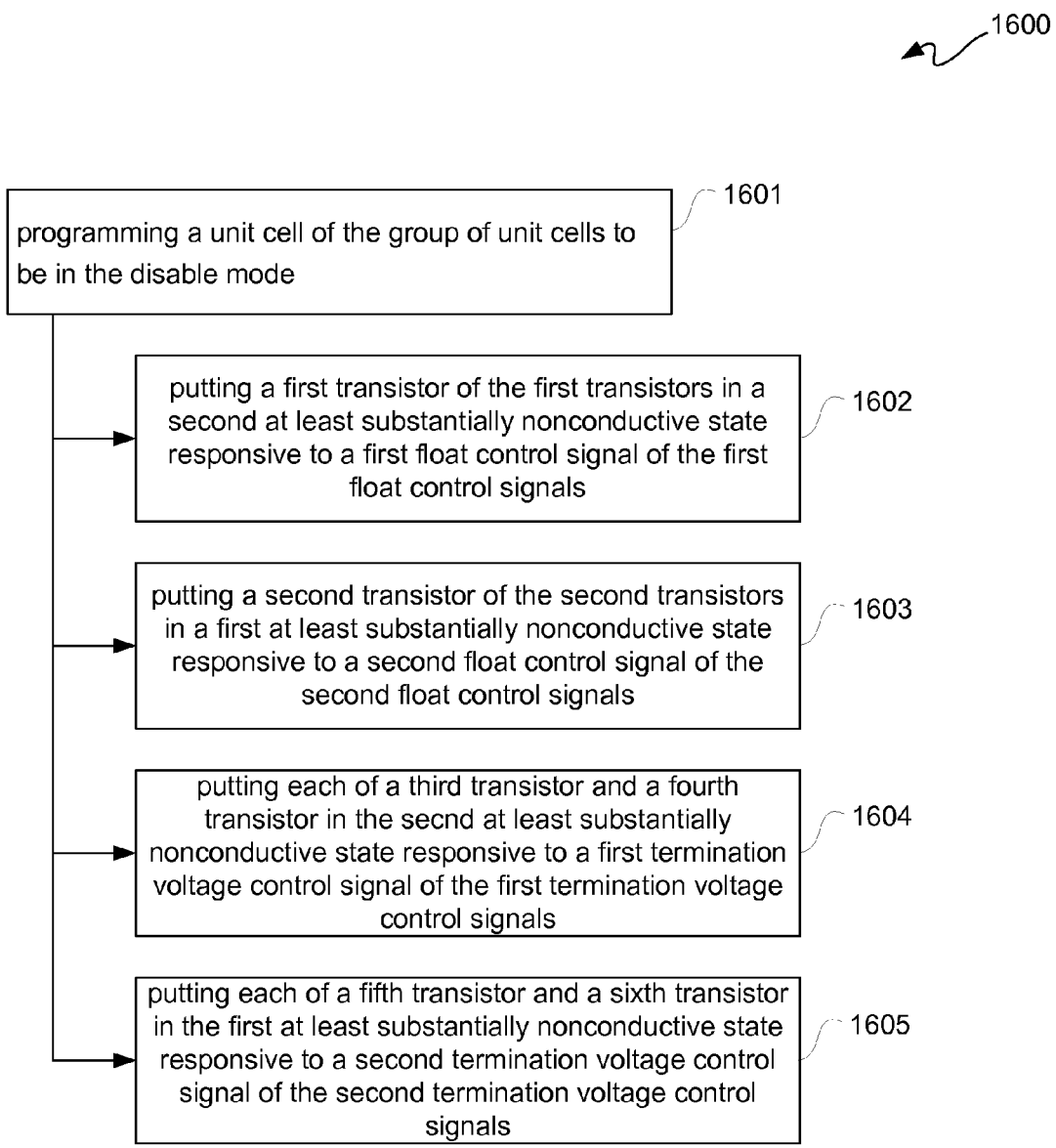
FIG. 16 is a flow diagram depicting an exemplary embodiment of a disable mode programming flow.

FIG. 16 is a flow diagram depicting an exemplary embodiment of a disable mode programming flow 1600. At 1601, a unit cell, such as unit cell 1000, of a group of unit cells, such as unit cells 1000-0 through 1000-31, is programmed to be in a disable mode. Programming a unit cell to be in a disable mode at 1601 may be performed by performing operations 1602 through 1605, which operations may all be performed concurrently.

At 1602, a first transistor, such as transistor 1001, of the unit cell to be programmed at 1601, is put in a second at least substantially nonconductive state responsive to a first float control signal of the first float control signals, such as float enable signal 1010 which is provided with other float enable signals 1010 via float enable bus 1110. Again, by a second at least substantially nonconductive state, it is generally meant not providing a p-channel in a p-type transistor as float enable signal 1010 applied to a gate thereof is inactive logic high.

At 1603, a second transistor, such as transistor 1002, of the unit cell to be programmed at 1601, is put in a first at least substantially nonconductive state responsive to a second float control signal of second float control signals, such as float enable bar signal 1012 provided with other float enable bar signals 1012 via float enable bar bus 1111. Again, a first at least substantially nonconductive state generally refers to not providing an n-channel in an n-channel transistor, such as when float enable bar signal 1012 is inactive logic low as applied to a gate of n-channel transistor 1002. Operations 1604 and 1605 are the same as those operations at 1404 of FIG. 14 and 1305 of FIG. 13, respectively, and thus, such description is not repeated.

Even though FIGS. 13 through 16 generally refer to a unit cell 1000 that is programmed, it should be understood from such description that multiple unit cells 1000 may be programmed at a time. Such programming may put such unit cells 1000 in any of the four modes described.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. For example, even though differential input was described via input pads 502 and 532 of FIG. 10, such input in other embodiments may be single-ended. Furthermore, even though enable signals 611 and 613 of FIG. 10 were described as complementary signals, such control signals in other embodiments may be controlled independently from one another. Claim(s) listing steps do not imply any order of the steps. Trademarks are the property of their respective owners.

What is claimed is:

1. A unit cell for a programmable termination circuit, comprising:
   a first transistor having a first source node coupled to a first input node, having a first drain node coupled to a second input node, and having a first gate coupled to receive a first float control signal;
   a second transistor having a second source node coupled to the second input node, having a second drain node coupled to the first input node, and having a second gate coupled to receive a second float control signal;
   a third transistor having a third drain node coupled to the first input node, having a third source node coupled to a first termination voltage node, and having a third gate coupled to receive a first termination voltage control signal;
   a fourth transistor having a fourth drain node coupled to the second input node, having a fourth source node coupled to the first termination voltage node, and having a fourth gate coupled to receive the first termination voltage control signal;
   a fifth transistor having a fifth drain node coupled to the second input node, having a fifth source node coupled to a second termination voltage node, and having a fifth gate coupled to receive a second termination voltage control signal; and
   a sixth transistor having a sixth drain node coupled to the first input node, having a sixth source node coupled to the second termination voltage node, and having a sixth gate coupled to receive the second termination voltage control signal;
   wherein the first float control signal and the second float control signal are a first pair of complementary signals.

2. The unit cell according to claim 1, wherein the unit cell is programmable to be put in any one of four modes.

3. The unit cell according to claim 2, wherein:
   the first termination voltage control signal and the second termination voltage control signal are a second pair of complementary signals; and
   the four modes are selected from a group consisting of a Vtt termination mode, a Vss termination mode, a float mode, and a disable mode.

4. The unit cell according to claim 3, further comprising:
   a first resistor coupled between a first data input pad and the first input node; and
   a second resistor coupled between a second data input pad and the second input node.

5. The unit cell according to claim 4, wherein the first input pad and the second input pad are for a differential input.

6. The unit cell according to claim 2, wherein:
   the first termination voltage node is associated with a first termination voltage level;
   the second termination voltage node is associated with a second termination voltage level; and
   the first termination voltage level is substantially greater than the second termination voltage level.

7. The unit cell according to claim 6, wherein:
   the first termination voltage level is a Vtt voltage level; and
   the second termination voltage level is a Vss voltage level.

8. A method for programming a termination circuit, comprising:
   providing a group of unit cells;
   providing a first float control signal bus coupled to the group of unit cells;
   providing a second float control signal bus coupled to the group of unit cells;

providing a first termination voltage control signal bus coupled to the group of unit cells;

providing a second termination voltage control signal bus coupled to the group of unit cells;

setting states of first transistors of the group of unit cells responsive to first float control signals provided via the first float control signal bus;

setting states of second transistors of the group of unit cells responsive to second float control signals provided via the second control signal bus;

setting states of third transistors and fourth transistors of the group of unit cells responsive to first termination voltage control signals provided via the first termination voltage control signal bus; and setting states of fifth transistors and sixth transistors of the group of unit cells responsive to second termination voltage control signals provided via the second termination voltage control signal bus; and operating each unit cell of the group of unit cells responsive to programming thereof in any of a plurality of modes selected from a group of four modes.

9. The method according to claim 8, wherein the group of four modes consists of a Vtt termination mode, a Vss termination mode, a float mode, and a disable mode.

10. The method according to claim 9, wherein the operating includes:

programming a unit cell of the group of unit cells to be in the Vtt termination mode;

the unit cell including a first transistor of the first transistors, a second transistor of the second transistors, a third transistor of the third transistors, a fourth transistor of the fourth transistors, a fifth transistor of the fifth transistors, and a sixth transistor of the sixth transistors; and the programming including:

putting the first transistor of the first transistors in a first at least substantially conductive state responsive to a first float control signal of the first float control signals;

putting the second transistor of the second transistors in a second at least substantially conductive state responsive to a second float control signal of the second float control signals;

putting each of the third transistor and the fourth transistor in the first at least substantially conductive state responsive to a first termination voltage control signal of the first termination voltage control signals; and putting each of the fifth transistor and the sixth transistor in an at least substantially nonconductive state responsive to a second termination voltage control signal of the second termination voltage control signals.

11. The method according to claim 10, wherein:

the first transistor, the third transistor, and the fourth transistor are p-type transistors;

the second transistor, the fifth transistor, and the sixth transistor are n-type transistors;

the first at least substantially conductive state is for p-channel conductivity;

the second at least substantially conductive state is for n-channel conductivity; and the at least substantially nonconductive state is for n-channel nonconductivity.

12. The method according to claim 9, the operating includes:

programming a unit cell of the group of unit cells to be in the Vss termination mode;

the unit cell including a first transistor of the first transistors, a second transistor of the second transistors, a third transistor of the third transistors, a fourth transistor of the fourth transistors, a fifth transistor of the fifth transistors, and a sixth transistor of the sixth transistors; and the programming including:

putting the first transistor of the first transistors in a first at least substantially conductive state responsive to a first float control signal of the first float control signals;

putting the second transistor of the second transistors in a second at least substantially conductive state responsive to a second float control signal of the second float control signals;

putting each of the third transistor and the fourth transistor in an at least substantially nonconductive state responsive to a first termination voltage control signal of the first termination voltage control signals; and putting each of the fifth transistor and the sixth transistor in the second at least substantially conductive state responsive to a second termination voltage control signal of the second termination voltage control signals.

13. The method according to claim 9, the operating includes:

programming a unit cell of the group of unit cells to be in the float mode;

the unit cell including a first transistor of the first transistors, a second transistor of the second transistors, a third transistor of the third transistors, a fourth transistor of the fourth transistors, a fifth transistor of the fifth transistors, and a sixth transistor of the sixth transistors; and the programming including:

putting the first transistor of the first transistors in a first at least substantially conductive state responsive to a first float control signal of the first float control signals;

putting the second transistor of the second transistors in a second at least substantially conductive state responsive to a second float control signal of the second float control signals;

putting each of the third transistor and the fourth transistor in a first at least substantially nonconductive state responsive to a first termination voltage control signal of the first termination voltage control signals; and putting each of the fifth transistor and the sixth transistor in a second at least substantially nonconductive state responsive to a second termination voltage control signal of the second termination voltage control signals.

14. The method according to claim 9, the operating includes:

programming a unit cell of the group of unit cells to be in the disable mode;

the unit cell including a first transistor of the first transistors, a second transistor of the second transistors, a third transistor of the third transistors, a fourth transistor of the fourth transistors, a fifth transistor of the fifth transistors, and a sixth transistor of the sixth transistors; and the programming including:

putting the first transistor of the first transistors in a first at least substantially nonconductive state responsive to a first float control signal of the first float control signals;

putting the second transistor of the second transistors in a second at least substantially nonconductive state responsive to a second float control signal of the second float control signals;

putting each of the third transistor and the fourth transistor in the first at least substantially nonconductive state responsive to a first termination voltage control signal of the first termination voltage control signals; and putting each of the fifth transistor and the sixth transistor in the second at least substantially nonconductive state responsive to a second termination voltage control signal of the second termination voltage control signals.

15. A programmable termination circuit, comprising:
a group of unit cells;
control circuit coupled to the group of unit cells via control signal buses for conducting a first float control signal, a first termination voltage control signal, and a second termination voltage control signal; and
each of the unit cells including:
- a first float transistor for having a first source/drain node coupled to a first input node, a second source/drain node coupled to a second input node, and a first float control gate coupled to receive the first float control signal;
- a first termination voltage transistor having a first drain node coupled to the first input node, a first source node coupled to a termination voltage supply node, and a first termination voltage control gate coupled to receive the first termination voltage control signal; and
- a second termination voltage transistor having a second drain node coupled to the second input node, a second source node coupled to a termination voltage ground node, and a second termination voltage control gate coupled to receive the second termination voltage control signal.

16. The programmable termination circuit according to claim 15, wherein:
the control signal buses are further for conducting a second float control signal;
each of the unit cells further includes:
- a second float transistor for having a third source/drain node coupled to the first input node, a fourth source/drain node coupled to the second input node, and a second float control gate coupled to receive the second float control signal;
- a third termination voltage transistor having a third drain node coupled to the second input node, a third source node coupled to the termination voltage supply node, and a third termination voltage control gate coupled to receive the first termination voltage control signal; and
- a fourth termination voltage transistor having a fourth drain node coupled to the first input node, a fourth source node coupled to the termination voltage ground node, and a fourth termination voltage control gate coupled to receive the second termination voltage control signal.

17. The programmable termination circuit according to claim 16, wherein the control signal buses include a first float control signal bus, a second float control signal bus, a first termination voltage control signal bus, and a second termination voltage control signal bus.

18. The programmable termination circuit according to claim 17, wherein the control signal buses are for putting one or more of the unit cells in any one of four modes.

19. The programmable termination circuit according to claim 18, wherein the four modes are selected from a group consisting of a Vtt termination mode, a Vss termination mode, a float mode, and a disable mode.

20. The programmable termination circuit according to claim 19, wherein each of the unit cells includes:
a first resistor coupled between a first data input pad and the first input node; and
a second resistor coupled between a second data input pad and the second input node.

* * * * *